(12) United States Patent
Ha

(10) Patent No.: US 6,464,448 B1
(45) Date of Patent: *Oct. 15, 2002

(54) SUBSTRATE TRANSPORT APPARATUS

(75) Inventor: Tuan T. Ha, Dedham, MA (US)

(73) Assignee: Brooks Automation, Inc., Chelmsford, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/145,008

(22) Filed: Sep. 1, 1998

(51) Int. Cl.$^7$ ................................................ B25J 18/04
(52) U.S. Cl. ...................... 414/744.5; 414/917; 901/15; 901/21; 74/490.04
(58) Field of Search ................. 414/744.5, 744.6, 414/917; 901/15, 21; 74/490.01, 490.04, 490.05, 490.06

(56) References Cited

U.S. PATENT DOCUMENTS

| | | | |
|---|---|---|---|
| 4,712,971 A | * 12/1987 | Flyer | 901/15 X |
| 5,147,175 A | * 9/1992 | Tada | 414/744.5 |
| 5,151,008 A | 9/1992 | Ishida et al. | 414/744.5 |
| 5,180,276 A | 1/1993 | Hedrickson | 414/752 |
| 5,404,894 A | 4/1995 | Shiraiwa | 134/66 |
| 5,577,879 A | 11/1996 | Eastman et al. | 414/744.5 |
| 5,647,724 A | 7/1997 | Davis, Jr. et al. | 414/744.5 |
| 5,788,453 A | * 8/1998 | Donde et al. | 414/744.5 |

FOREIGN PATENT DOCUMENTS

| | | | |
|---|---|---|---|
| JP | 0311237 | * 12/1990 | 414/744.5 |
| WO | WO 94/23911 | 10/1994 | |
| WO | WO 97/26117 | 7/1997 | |

* cited by examiner

Primary Examiner—Donald W. Underwood
(74) Attorney, Agent, or Firm—Perman & Green, LLP

(57) ABSTRACT

A substrate transport apparatus comprising a drive section and an articulated arm assembly. The articulated arm assembly is pivotably mounted to the drive section. The arm assembly has a first end connected to the drive section and a second end opposite the first end. An end effector is supported from the second end of the arm assembly. The articulated arm comprises a pair of opposing forearms on opposite sides of an axis of translation of the end effector. The axis of translation extends substantially over a center of the first end of the drive assembly. When the arm assembly is retracted to a home position the second end of the arm assembly is over the center of the first end of the arm assembly. Also, when the arm assembly is retracted to its home position, the opposing forearms are angled relative to the axis of translation at an angle of about 90°.

16 Claims, 10 Drawing Sheets

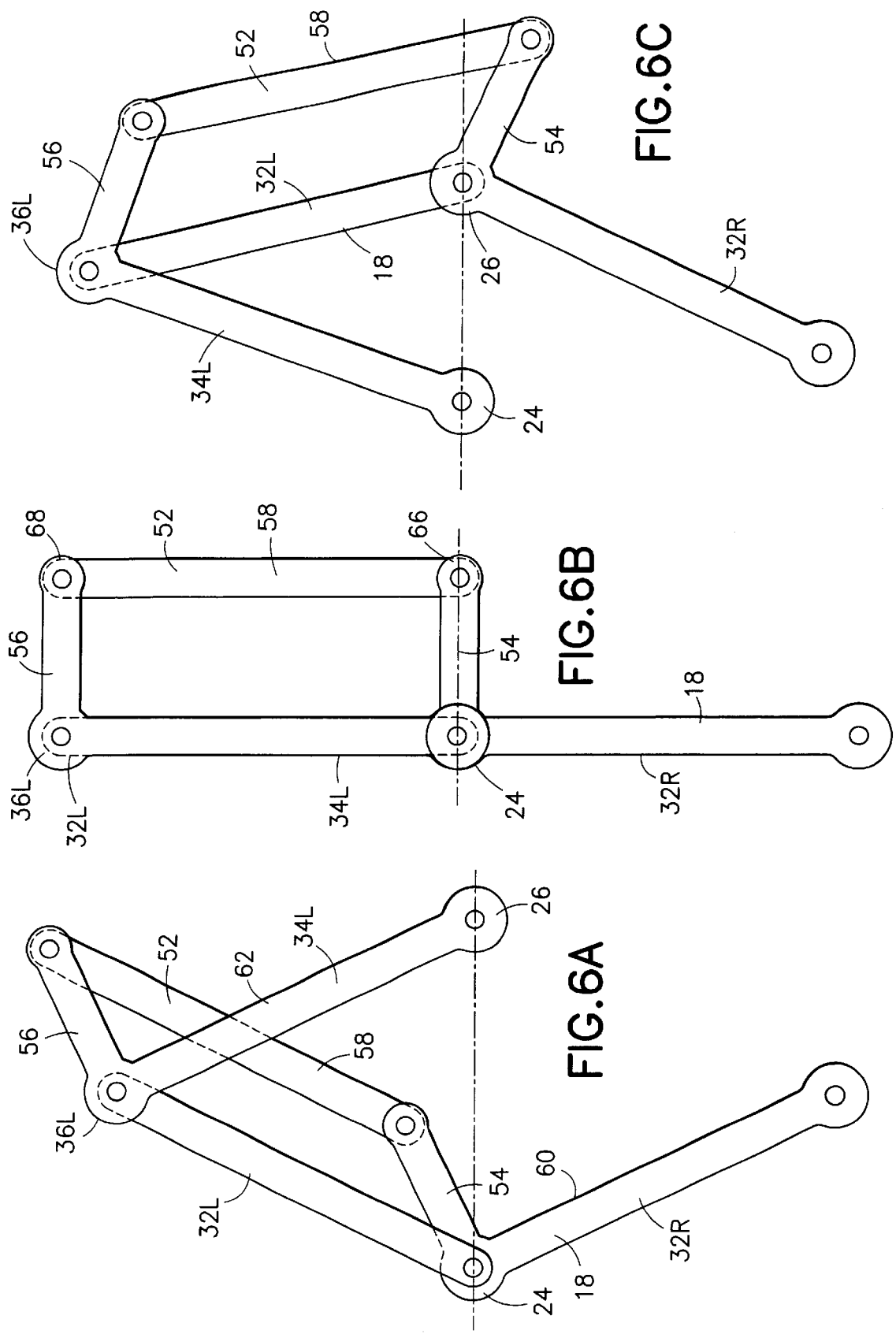

SUBSTRATE TRANSPORT APPARATUS

BACKGROUND OF THE INVENTION

1. Field of the Invention

This invention relates to a substrate transport apparatus and, more particularly, to a substrate transport apparatus with an articulated arm supporting a substrate holding support.

2. Prior Art

Various types of substrate transport apparatus with articulated arms are described in the following art:

U.S. Pat. No. : 5,151,008
U.S. Pat. No. : 5,180,276
U.S. Pat. No. : 5,404,894
U.S. Pat. No. : 5,577,879
U.S. Pat. No. : 5,647,724
PCT Publication No.: WO 94/23911
PCT Publication No.: WO 97/26117

SUMMARY OF THE INVENTION

In accordance with one embodiment of the present invention, a substrate transport apparatus is provided. The substrate transport apparatus comprises a drive section and an articulated arm assembly. The articulated arm assembly is pivotably mounted to the drive section. The arm assembly has a first end connected to the drive section and the second end opposite the first end supporting an end effector thereon. The articulated arm comprises a pair of opposing forearms on opposite sides of an axis of translation of the end effector. The axis of translation extends substantially over the center of the first end of the drive assembly. When the arm assembly is retracted to a home position, the second end of the arm assembly is over the center of the first end of the arm assembly, and the opposing forearms are angled relative to the axis of translation at an angle of about 90°.

In accordance with another embodiment of the present invention, a substrate transport apparatus is provided comprising a drive section and a movable arm assembly. The movable arm assembly comprises two proximal arm members and two end effectors. Each proximal arm member is connected to the drive section so that the two proximal arm members are generally crossed. The end effectors are located at opposite ends of the proximal arm members, with each end effector being connected to an end of each proximal arm member. When the end effectors are over the drive section, the proximal arm members are vertically aligned.

In accordance with still another embodiment of the present invention a substrate transport apparatus is provided. The substrate transport apparatus comprises a frame, an articulated arm having a pair of opposing upper arms and a pair of forearms, means for synchronously rotating one of the forearms and a pair of counter rotating elements. In addition to the upper arms and forearms the articulated arm has an end effector. The upper arms are pivotably connected to the frame at a shoulder joint of the articulated arm. A first one of the forearms is pivotably connected to a first one of the upper arms at a first elbow joint of the articulated arm. A second one of the forearms is pivotably connected to a second one of the upper arms at a second elbow joint. The forearms are pivotably connected to the end effector at a wrist joint of the articulated arm. The means for rotating a forearm synchronously rotate an elbow end of the second forearm with the rotation of the first upper arm. The means for synchronously rotating the second forearm comprise at least one rotation transfer element extending between a shoulder end of the first upper arm and an elbow end of the second forearm so that rotation of the first upper arm directly rotates the elbow end of the second forearm. The pair of counter rotating elements are supported by the forearms. The counter rotating elements counter rotate relative to each other about a common axis of rotation at the wrist joint. The counter rotating elements restrainingly contact the end effector to guide the end effector true to an axis of translation of the end effector.

BRIEF DESCRIPTION OF THE DRAWINGS

The foregoing aspects and other features of the invention are explained in the following description, taken in connection with the accompanying drawings, wherein:

FIGS. 2–2C are schematic top plan views of the substrate transport apparatus shown in FIG. 1 with its movable arm assembly in three different positions;

FIGS. 6A–6C are schematic partial top plan views of the substrate transport apparatus shown in FIG. 1, showing an alternate embodiment of an upper arm to forearm transmission assembly on the movable arm assembly, in three different positions;

FIG. 8 is a schematic top plan view of an alternate embodiment of the present invention;

DETAILED DESCRIPTION OF THE PREFERRED EMBODIMENTS

Figure 1:
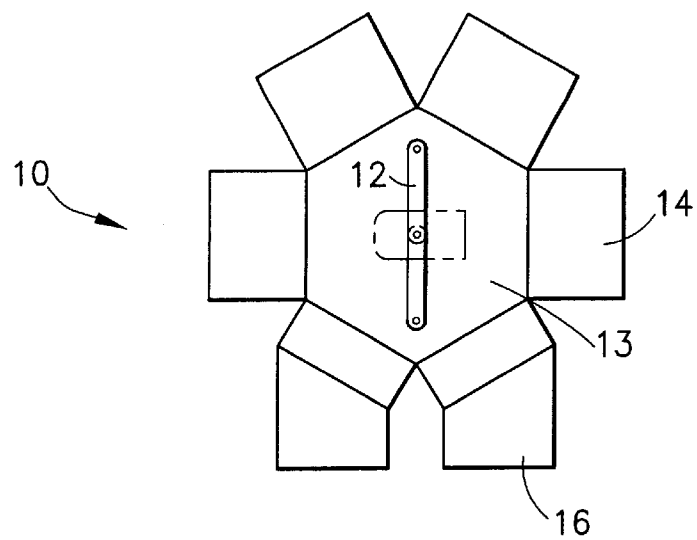
FIG. 1 is a schematic top plan view of a substrate processing apparatus having a substrate transport apparatus incorporating features of the present invention.

Referring to FIG. 1, there is shown a schematic top plan view of a substrate processing apparatus 10 having a substrate transport apparatus 12 incorporating features of the present invention. Although the present invention will be described with reference to the embodiments shown in the drawings, it should be understood that the present invention may be embodied in many forms of alternative embodiments. In addition, any suitable size, shape or type of materials or elements could be used.

In addition to the substrate transport apparatus 12, the substrate processing apparatus 10 has a main chamber 13, substrate processing chambers 14, and load locks 16. The substrate processing chambers 14 and load locks 16 are connected to the main chamber 13. The main chamber 13 may contain a vacuum or gases at a predetermined pressure. The chamber 13 may also be vented to atmosphere. The substrate transport apparatus 12 is located, at least in part, within the main chamber 13. The substrate transport apparatus is adapted to move planar substrates, such as flat panel display substrates or semiconductor wafers, among the load locks 16 and substrate processing chambers 14.

Figure 2:
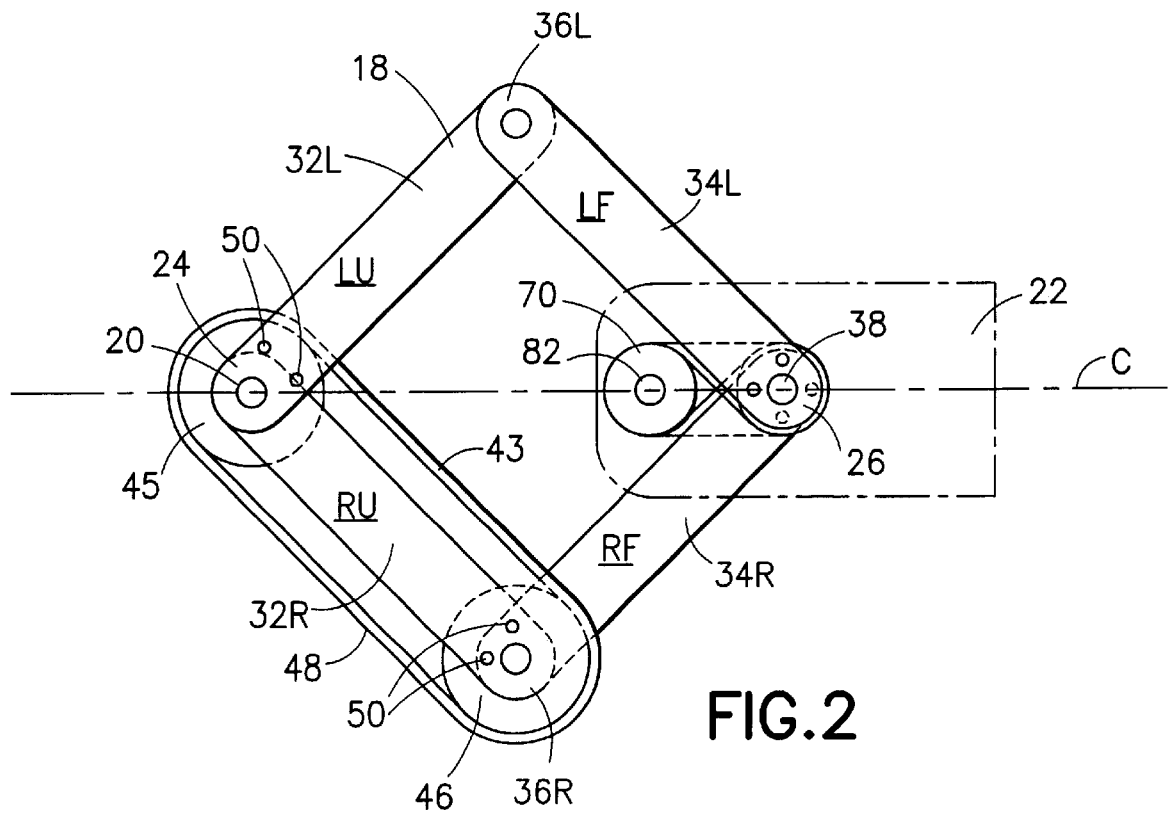
FIG. 2 is a top plan view of the substrate transport apparatus shown in FIG. 1 in a somewhat extended configuration.
Figure 3:
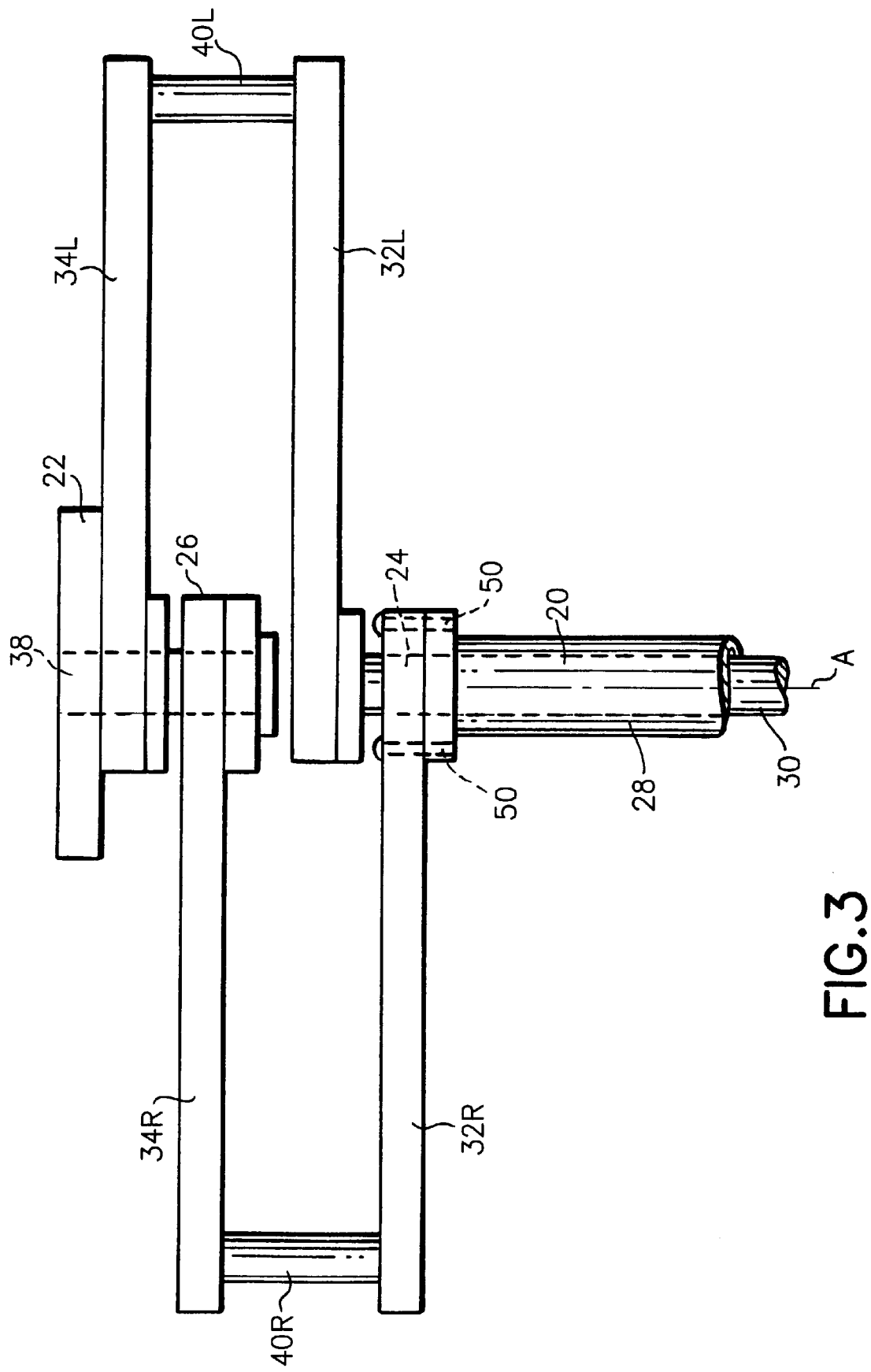
FIG. 3 is a partial front view of the substrate transport apparatus shown in FIG. 2.

Referring also to FIG. 2 and FIG. 3, the substrate transport apparatus 12 comprises a movable arm assembly 18, a drive assembly 20 and an end effector 22. The drive assembly 20 supports the movable arm assembly 18 which in turn supports the end effector 22. The drive assembly 20 is connected to the substrate processing apparatus 10 as in known in the art. The movable arm assembly 18 is articulated to extend and retract. The movable arm assembly 18 has a shoulder end 24 and a wrist end 26. The movable arm assembly 18 is supported by the drive assembly 20 from the shoulder end 24. The end effector 22 is carried by the wrist end 26 of the movable arm assembly 18. The end effector 22 is adapted to stably support substrates thereon. The end effector 22 may comprise a vacuum chuck or other means to hold the substrate on the end effector 22.

The drive assembly 20 has coaxial drive shafts 28, 30, (see FIG. 3). The co-axial drive shafts include an outer spool shaft 28 and an inner shaft 30 rotatably located within the spool shaft 28. The two shafts 28, 30 are axially rotatable in unison with each other in both clockwise and counterclockwise directions. The two shafts 28, 30 are also axially counter-rotatable relative to each other so that when the spool shaft 28 rotates clockwise the inner shaft rotates counter clockwise and when the spool shaft 28 rotates counter-clockwise the inner shaft rotates clockwise. The co-axial drive shafts 28, 30 are driven by motors as is known in the art. An example of a drive assembly having co-axial shafts is disclosed in U.S. Pat. No. 5,270,600 which is hereby incorporated by reference in its entirety. However, any suitable type of drive assembly could be used including drives without co-axial shafts or drives with more than two drive shafts.

The movable arm assembly 18 comprises a pair of upper arm links 32L, 32R and a pair of forearm links 34L, 34R. The upper arm links 32L, 32R and the forearm links 34L, 34R are of equal length and are arranged to form a general trapezoidal shape when looking at the top of the movable arm assembly 18 (see FIG. 2). Each upper arm link 32L, 32R is pivotably connected to a respective forearm link 34L, 34R giving the movable arm assembly 18 a pair of opposing elbow joins 36L, 36R. Each upper arm link 32L, 32R spans between a corresponding elbow joint 36L, 36R and the shoulder end 24 of the arm 18. Each forearm link 34L, 34R spans between a corresponding elbow joint 36L, 36R at the wrist end 26 of the arm assembly 18. In the preferred embodiment, the upper arm links 32L, 32R are supported by the co-axial shafts 28, 30 of the drive assembly 20. Each upper arm links 32L, 32R is fixedly connected to a corresponding shaft 28, 30. Hence, as each shaft 28, 30 turns so does the upper arm link 32L, 32R fastened to that shaft. For example, FIG. 3 shows the left upper arm link 32L fastened to the inner shaft 30 and the right upper arm link 32R fastened to the spool shaft 28, although in an alternate embodiment this arrangement may be reversed. Thus, rotating the spool shaft 28 rotates the right upper arm link 32R and rotating the inner shaft 30 rotates the left upper arm link 32L. The left and right upper arm links 32L, 32R rotate about a common axis of rotation A at the shoulder end 24 of the movable arm assembly 18. In alternate embodiments, the upper arm links may be connected to the drive assembly so that each link rotates about a different axis of rotation at the shoulder end of the arm assembly. The forearm links 34L, 34R are pivotably connected to each other at the wrist end 26 of the arm assembly 18. In the preferred embodiment, the left and right forearm links 34L, 34R are connected by a common pivot shaft 38 (see FIG. 3). Hence, the left and right forearm links 34L, 34R rotate relative to each other at the wrist end 26 of the arm assembly 18 about a common axis or rotation. In alternate embodiments, the forearm links may be pivotably connected at the wrist end of the arm assembly so that the forearm links rotate at the wrist end about different axes of rotation. The upper arm links 32L, 32R and forearm links 34L, 34R are vertically staggered as shown in FIG. 3 to allow extension and retraction of the movable arm assembly 18. The upper arm links 32L, 32R are located below the forearm links 34L, 34R. This allows the forearm links 34L, 34R to move over the upper arm links 32L, 32R without interference. A pair of pivot shafts 40L, 40R, one at each elbow joint 36L, 36R, pivotably connect the forearm links 34L, 34R to the upper arm links 32L, 32R below. The right upper arm and forearm links 32R, 34R are also vertically offset relative to the corresponding left upper arm and forearm links 32L, 34L. This eliminates interference between the right and left forearms 34R, 34L as they rotate relative to each other and between the right and left upper arms 32R, 32L as they rotate relative to each other. In the preferred embodiment, the right side upper arm link 32R is located below the left side upper arm link 32L. The right side forearm link 34R is located below the left side forearm link 34L. In alternate embodiments, the right links may be located above the left links for both the upper arms and forearms. In yet other alternate embodiments, the right links and left links of the movable arm assembly may have any other suitable vertical stagger combination which allows the right upper arm and forearm links to swing relative to their corresponding left links without interference between the links.

Figure 2A:
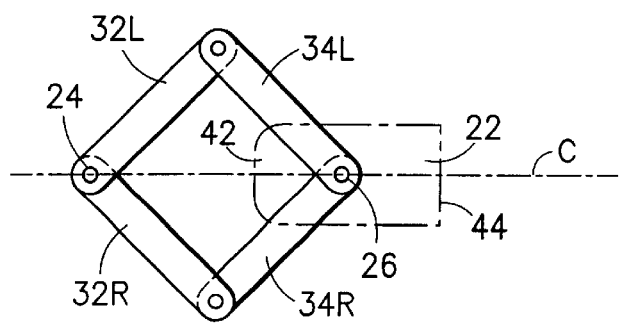
Figure 2B:
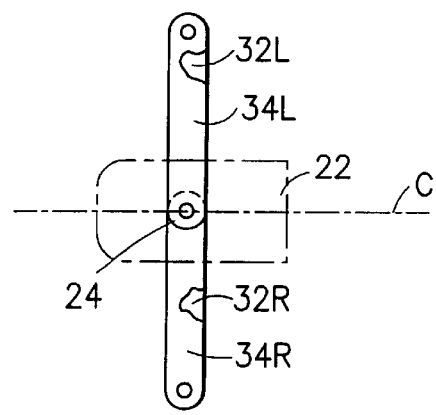
Figure 2C:
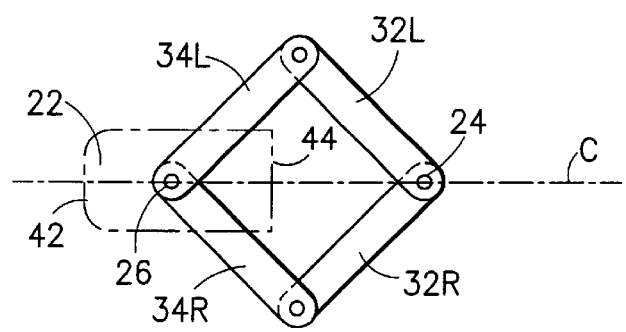

Movement of the end effector 22 to transport a substrate between the processing chambers 14 and load locks 16 is effected by a suitable combination of pure rotation of the movable arm assembly 18 and extension or retraction of the movable arm assembly 18. Pure rotation of the movable arm assembly 18 rotates the end effector 22 about axis A at the shoulder end 24 of the arm assembly 18. The movable arm assembly 18 can be rotated as a unit about axis A at the shoulder end 24, by rotating the co-axial shafts 28, 30 in unison with each other. When the co-axial shafts rotate in unison, the left and right upper arm links 32L, 32R, which are fixedly connected to the inner shaft 30 and spool shaft 28 respectively, also rotate in unison with each other. As a result of the lack of relative motion between the left and right upper arm links 32L, 32R, the entire movable arm assembly 18, including the end effector 22, rotates as a unit about the axis of rotation A at the shoulder end 24 of the arm 18. For example, when the co-axial shafts 28, 30 are rotated clockwise in unison, the right upper arm link 32R and the left upper arm link 32L, which are respectively fixedly connected to the spool shaft 28 and inner shaft 30, rotate in unison in a clockwise direction. As the upper arm links 32R, 32L rotate in unison, the position of the right and left upper arm links 32R, 32L relative to each other remains unchanged. Hence, the position of the forearm links 34R, 34L which are connected to the upper arm links 32R, 32L is also unchanged relative to each other. Therefore, the forearm links 34R, 34L and the end effector 22 supported therefrom rotate together with the upper arm links 32R, 32L about the axis of rotation A at the shoulder end 24 of the movable arm assembly 18. Extension or retraction of the movable arm assembly 18 translates its wrist end 26, and thus the end effector 22, in a substantially rectilinear manner. The translation of the end effector 22 proceeds along an axis C which extends substantially over the center of the shoulder end 24 of the arm 18. The end effector 22 has an initial or home position and two deployed positions on the axis of translation C. FIGS. 2A–2C show the configuration of the movable arm assembly 18 with the end effector 22 in its home position and its two deployed positions. The home and deployed positions represent the bounds of translation of the end effector 22 along the translation axis C. FIG. 2B depicts the movable arm 18 with the end effector 22 in its home position. FIG. 2A shows the arm assembly 18 when the end effector is in the forward deployed position, and FIG. 2C shows the arm assembly 18 when the end effector is in the rear deployed position. When the end effector 22 is in its home position, the movable arm assembly 18 is fully retracted. In this position, retraction of the movable arm assembly 18 from a prior extended position is complete, and the end effector 22 is closest to the rotation axis A at the shoulder end 24 of the arm 18 than from any other point on the transaction axis C of the end effector 22 (see FIG. 2B). When the end effector is in its home position, the wrist end 26 of the movable arm assembly 18 is substantially over its shoulder end 24. The trapezoidal planform of the movable arm assembly 18, evident when the arm 18 is extended somewhat as shown in FIG. 2, collapses so that the right and left upper arm links 32R, 32L and the right and left forearm links 34R, 34L are generally co-linear as shown in FIG. 2B. Furthermore, the forearm links 34 R, L are located substantially directly over the respective upper arm links 32R, 32L. This position also results in the right upper arm and forearm links 32R, 34R and the left upper arm and forearm links 32L, 34L being aligned at an angle of about 90° relative to the transaction axis C. From its home position shown in FIG. 2B, the end effector 22 is translated along axis C to its forward deployed position shown in FIG. 2A by extending the movable arm assembly 18 forward. When the end effector 22 is in its forward deployed position, its rear end 42 is closer to the shoulder end 24 of the arm 18 than the front end 44 of the end effector. Also, from its home position, the end effector 22 is translated along axis C to its rear deployed position shown in FIG. 2C by extending the movable arm assembly 18 to the rear. When the end effector 22 is in its rear deployed position, its front end 44 is closer to the shoulder end 24 of the arm assembly 18 than the rear end 42 of the end effector 22. To return the end effector 22 from either the forward deployed position shown in FIG. 2A or rear deployed position shown in FIG. 2C to its home position depicted in FIG. 2B, the movable arm assembly is retracted.

The movable arm assembly 18 can be extended or retracted by counter-rotating the co-axial shafts 28, 30 relative to each other. To extend the movable arm assembly 18, the co-axial shafts are counter-rotated to rotate the upper arm links 32R, 32L inward or toward each other (see FIG. 2). The inward rotation of the upper arm links 32R, 32L moves the elbows 36R, 36L closer to each other and away from the shoulder end 24 of the arm. Moving the elbows 36R, 36L away from the shoulder 24 moves the forearm link 34R, 34L and wrist 26 away from the shoulder 24. Furthermore, to accommodate the inward movement of the elbows 36R, 36L, the forearm links 34R, 34L pivot inward at the wrist 26 and pivot at the elbows 36R, 36L, relative to the corresponding upper arm links 32R, 32L. This double pivot action of the forearm links moves the wrist end 26 and hence the end effector 22 away from the shoulder end 24 of the arm 18 thereby extending the arm 18. For example, to extend the movable arm assembly 18 forward as shown in FIG. 2A, the spool shaft 28 is rotated counter-clockwise and the inner shaft 30 is rotated clockwise. Thus, the right upper arm link 32R rotates counter-clockwise and the left upper arm link 32L rotates clockwise. The counter rotating upper arm links 32R, 32L move the elbows 36R, 36L forward, away from the shoulder end 24, and inward toward the translation axis C. To accommodate the movement of the elbows 36R, 36L, the right forearm link 34R rotates clockwise relative to the adjoining right upper arm 32R, and the left forearm link 34C rotates counter clockwise relative to the adjoining left upper arm link 32L. The counter rotation of the forearm links 32R, 32L extends the end effector 22 forwards. The operation of the movable arm assembly 18 when it is being extended to the rear position shown in FIG. 2C is substantially the same as the operation of the arm 18 when it is extended forwards, except that in the case of rearward extension the direction of movement of the co-axial shafts 28, 30, the upper arm links 32R, 32L and the forearm links 34R, 34L is reversed from the movement of these elements when the arm 18 is extended forward. Hence, when extending the movable arm assembly 18 to the rear, the spool shaft 28 is rotated clockwise in lieu of counter-clockwise, the inner shaft is rotated counter-clockwise in lieu of clockwise and so on. Retraction of the movable arm assembly 18 from either the forward or reward extended positions is accomplished by counter-rotating the co-axial shafts 28, 30 relative to each other to rotate the upper arm links 32R, 32L outward or away from each other. Rotating the upper arm links 32R, 32L outward moves the elbows 36R, 36L closer to the shoulder end 24 of the arm 18, thereby drawing the forearm links 34L, 34R and the wrist end 26 of the arm 18 closer to the shoulder end 24. Rotating the upper arm links 32R, 32L apart also moves the elbows 36R, 36L outward thus spreading the forearm links 34R, 34L apart. In response to being spread apart at the elbows 36R, 36L, the forearm links 34R, 34L rotates about the respective elbows 36R, 36L and about the wrist end 26 bringing the wrist end 26 and the end effector 22 in, along axis of translation C, towards the shoulder end 24. For example, to retract the movable arm assembly 18 and move the end effector 22 from its forward position, shown in FIG. 2A, to its home position shown in FIG. 2B, the spool shaft 2B is rotated clockwise and the inner shaft 30 is rotated counter-clockwise. The right upper arm link 32R pivots with the spool shaft 28 in a clockwise direction and away from the left upper arm link 32L which is pivoting with the inner shaft 30 in a counter-clockwise direction. The elbows 36R, 36L are thus arcuately drawn towards the shoulder 24 (to the left in FIG. 2) by the counter rotating upper arm links 32R, 32L. The elbows 36R, 36L pull with them the forearm links 34R, 34L and end effector 22 toward the shoulder end 24. Furthermore, as the distance between the elbows 36R, 36L widens, the left forearm link 34L rotates clockwise about the pivot shaft 40L at the left elbow 36L, and the right forearm link 34R rotates counter-clockwise about the pivot shaft 40R at the right elbow 36R. The counter rotation of the forearm links 34R, 34L about their respective elbows 36R, 36L moves the wrist end 26 and end effector 22 in towards the shoulder 24 along axis of translation C.

Figure 4:
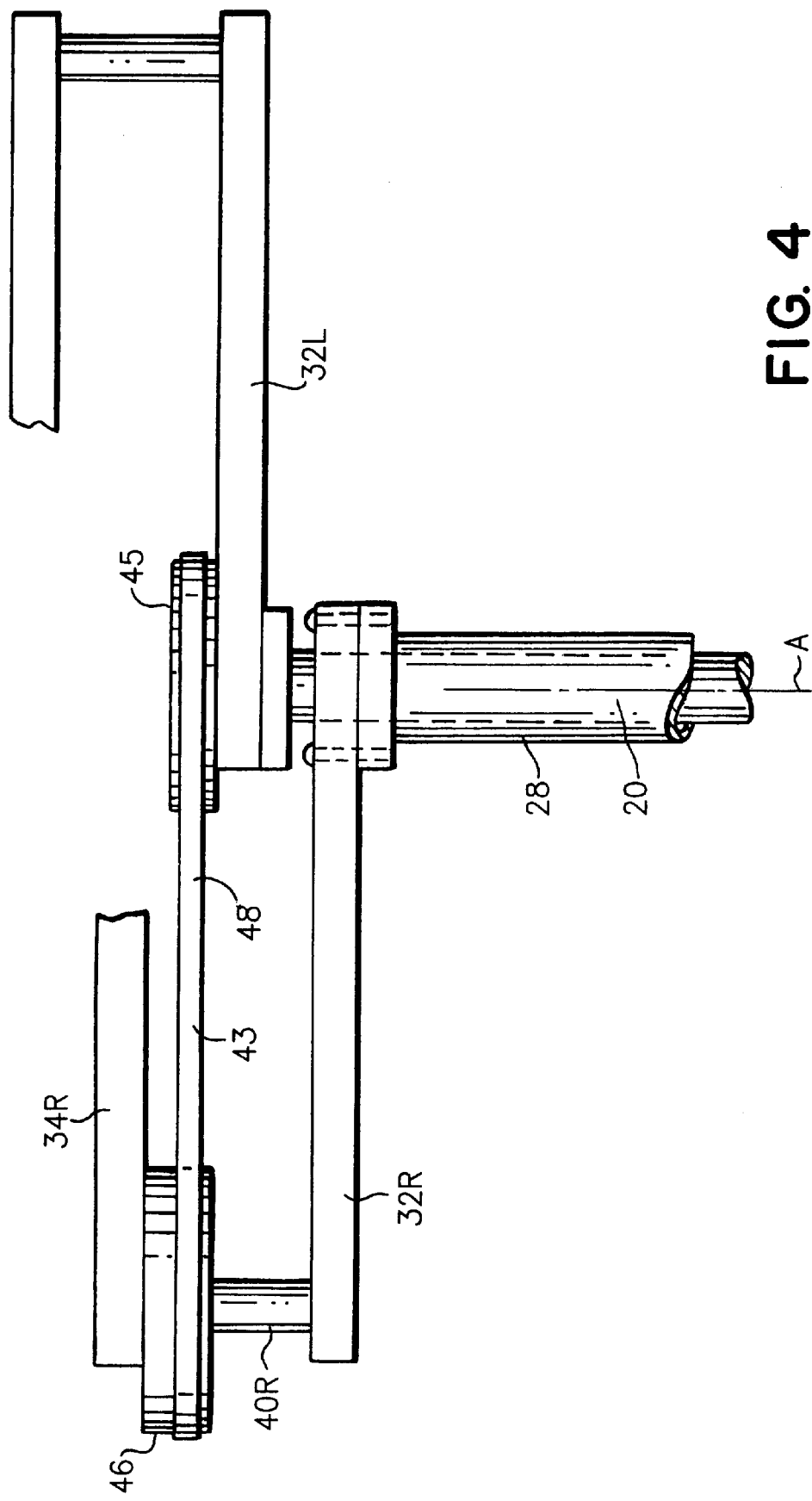
FIG. 4 is a second partial front view of the movable arm assembly shown in FIG. 2 showing a upper arm to forearm drive mechanism.

Referring to FIGS. 2 and 4, the movable arm assembly 18 also has a transmission assembly 43 connecting a forearm link to an upper arm link. FIGS. 2 and 4 depict a first embodiment of the transmission assembly 43. The transmission assembly 43 comprises a drive drum or pulley 45, a driven drum or pulley 46 and a transmission belt 48. In the preferred embodiment, the drive drum 45 is fixedly connected to the left upper arm link 32L and the driven drum 46 is fixedly connected to the right forearm link 34R. In an alternate embodiment, the drive drum may be connected to right upper arm link and the driven drum may be connected to the left forearm link. The drive drum 45 and driven drum 46 are fixedly connected to the corresponding links 32L, 34R by mechanical fasteners 50 although any suitable fastening means may be used. The drive drum 45 is mounted on the left upper arm link 32L so that the drum 45 and link 32L turn in unison about the common axis of rotation A at the shoulder end 24 (see FIG. 4). The driven drum 46 is mounted on the right forearm link 34R so that the drum 46 and link 34R turn in unison about the pivot shaft 40 R at the right elbow 36R. The transmission belt 48 is looped around the drive drum 45 and the driven drum 46, drivingly connecting the drive and driven drums 45, 46 so that the driven drum 46 turns in concert with the drive drum 45. The ratio of the diameter of the drive drum 45 to the diameter of the driven drum 46 is about 1:1. The transmission assembly 43 transmits torque imparted by the drive shaft 28 directly to the forearm link 34R to rotate the forearm link 34R at its elbow 36R synchronously with the upper arm link 32L. Thus, the transmission assembly 42 reduces the start up torque required to initiate extension of the movable arm assembly 18 from its home position shown in FIG. 2B. More importantly, the transmission assembly 43 insures that when the upper arm links 32R, 32L are rotated toward each other, the forearm links 34R, 34L counter rotate relative to the corresponding upper arm links 32R, 32L to extend the arm assembly 18 from its home position, and do not merely rotate in unison with the corresponding upper arm links 32R, 32L so that the wrist end 26 remains over the shoulder end 24. Rotation of the upper arm links 32R, 32L toward each other will necessarily extend the movable arm assembly 18 once the wrist end 26 is somewhat offset in the direction of extension to an axis connecting the elbows 36R, 36L. However, when the arm 18 is in the home position, shown in FIG. 2B, with the wrist end 26 substantially over the shoulder end 24 and substantially co-linear with the elbows 36R, 36L, rotation of the upper arm links 32R, 32L toward each other will not necessarily move the wrist end 26 away from the shoulder end 24. In this case, as the elbows 36R, 36L arcuately move inward and away from the shoulder end 24, the wrist end 26 may remain over the shoulder end 24, the forearm links 24 R, L merely pivoting about axis A, together with the corresponding upper arm links 32R, 32L without extending the arm assembly 18. The transmission assembly 43 prevents this from happening. For example, when the movable arm assembly 18 is extended from its home position shown in FIG. 2B to the forward position shown in FIG. 2A, the left upper arm link 32L, rotates clockwise due to the clockwise torque imparted by the inner shaft 30. The drive drum 45 turns in unison with the left upper arm link 32L. The clockwise torque is transmitted by the belt 48 from the drive drum 44 to the driven drum 46. The driven drum 46 synchronously rotates the right forearm link 34R clockwise in concert with the left upper arm link 32L and counter to the rotation of the right upper arm link 32R. The rotation of the right forearm link 34R is powered by the transmission assembly 43 and not merely slaved to the changes in the geometry of the movable arm assembly 18. Hence, the powered clockwise rotation of the right forearm link 34R thrust the wrist end 26 forwards away from the shoulder end 24 extending the arm 18 regardless of the initial position of the wrist end 26. The transmission assembly 42 assists the extension of the arm assembly 18 from its home position to its rear position shown in FIG. 2C in a similar manner except that the direction of motion is reversed. The torque transfer to the right forearm link 34R, by the transmission assembly 42, also eliminates the need to provide large forces tangential to the elbows 36R, 36L, and correspondingly lowers the torque demand on the drive assembly 20, in order to overcome the inertia of the end effector 22 and extend the arm 18 when the wrist end 26 is proximate the shoulder end 24.

Referring now to FIGS. 6A–6C, there is shown a plan view of a second embodiment of a transmission assembly or linkage 52 connecting an upper arm link 32R to a forearm link 34L. The transmission linkage 52 comprises the right upper arm link 32R having a crank 54 cantilevered therefrom, the left forearm link 34L having an extension member 56 cantilevered therefrom and a connecting rod 58 connecting the crank 54 to the extension member 56. In the preferred embodiment, the connecting rod 58 connects the right upper arm link 32R to the left forearm link 34L and is located forward of the upper arm links 32R, 32L (see FIG. 6B). In alternate embodiments, the connecting rod may connect the left upper arm link to the right forearm link and may be located to the rear of the upper arm links. The crank 54 cantilevers from the forward side 60 of the right upper arm link 32R at an angle about 90°, thereby forming a general "L" shape with the upper arm link 32R at the shoulder end 26. The extension member 56 projects from the forward side 62 of the left forearm link 34L at an angle of about 90° relative to the link 34L, thereby forming a general "L" shape with the forearm link 34L at the left elbow 36L. The connecting rod 58 is pivotably connected at its inner end 66 to the crank 54 and at its outer end 68 to the extension member 56. The connecting rod 58 is connected to the crank 54 and the extension member 56 so that the connecting rod is substantially parallel to the left upper arm link 32L (see FIG. 6B). FIG. 6B shows the top plan configuration of the transmission linkage 52 when the movable arm assembly 18 is retracted to its home position with the wrist end 26 over the shoulder end 24 (see also FIG. 2B). FIG. 6A shows the top plan configuration of the transmission linkage 52 when the movable arm assembly 18 is between the home position and the forward extended position shown in FIG. 2A. FIG. 6C shows the top plan configuration of the transmission linkage 52 when the movable arm assembly 18 is between the home position and the rear extended position shown in FIG. 2C. The function of the transmission linkage 52 is the same as the transmission assembly 42 (depicted in FIGS. 2 and 4), to transfer torque from the upper arm link 32R directly to the forearm link 34L facilitating extension of the arm assembly 18 from its home position. The transmission linkage accomplishes this function through the eccentric loads generated by the connecting rod 58, under the impetus of the crank 54, on the left forearm link 34L. The eccentric load exerted by the connecting rod 58 on the left forearm link 34L forces its rotation about the elbow 36L. For example, when extending the movable arm assembly 18 from its home position shown in FIG. 2B to its forward position shown in FIG. 2A the right upper arm link rotates counter clockwise.

Thus, the crank 54 rotates counter-clockwise pushing the connecting rod 58 to the left into the extension member 56 (see FIG. 6A). The axial force exerted by the connecting rod 58 on the extension member 56, rotates the extension member 56 and with it the left forearm link 34L clockwise about the left elbow 36L in synchronicity with the rotation of the right upper arm link 34. The clockwise rotation of the left forearm link 34L moves the wrist end 26 of the arm 18 away from the shoulder end 24. The positive rotation imparted by the crank 54 and connecting rod 58 on the left forearm 34L thrusts the wrist end 26 away from the shoulder end 24 regardless of the position of the wrist end 26. The transmission linkage 52 operates in a similar manner when the arm 18 is extended from its home position to its rear position shown in FIG. 2C, except directions of movement are reversed. As seen in FIG. 6C, the right upper arm link 32R and crank 54 rotate clockwise pulling the connecting rod 58 and hence the extension member 56 to the right. The eccentric loading on the extension member 56 rotates it and the left forearm 34L clockwise about the elbow 36 L. The clockwise rotation of the left forearm link moves the wrist end 26 rearward away from the shoulder end 24.

Figure 5:
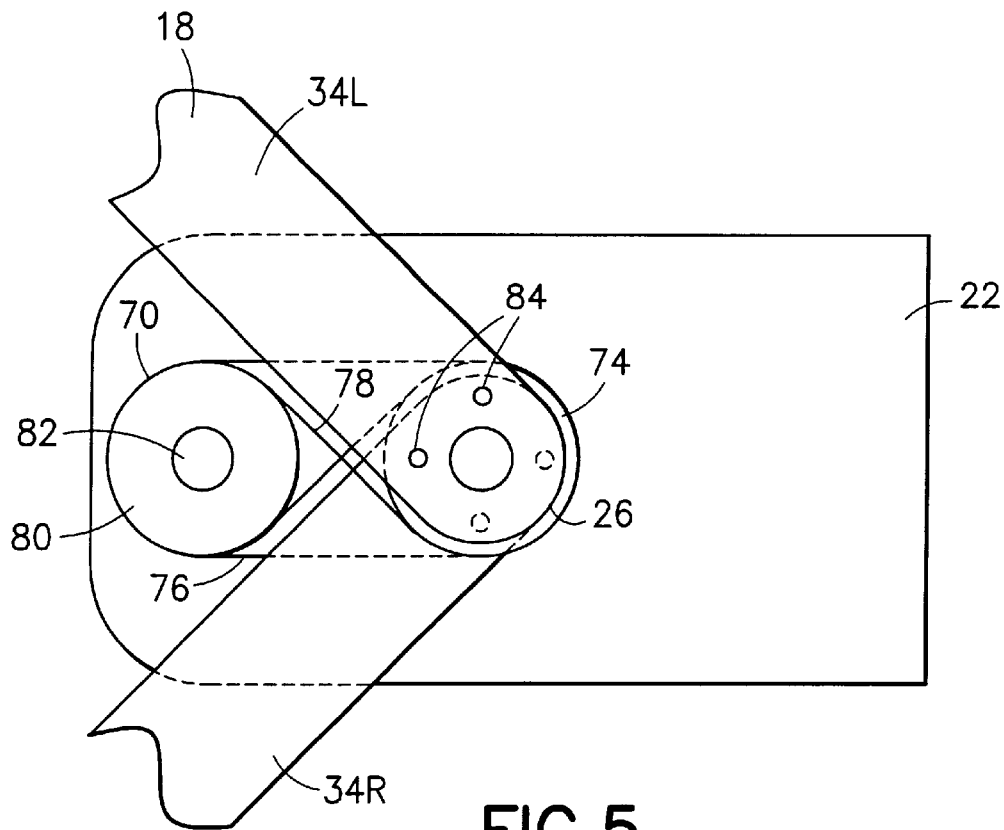
FIG. 5 is a partial top plan view of an end effector alignment mechanism of the movable arm assembly shown in FIG. 2.
Figure 5A:
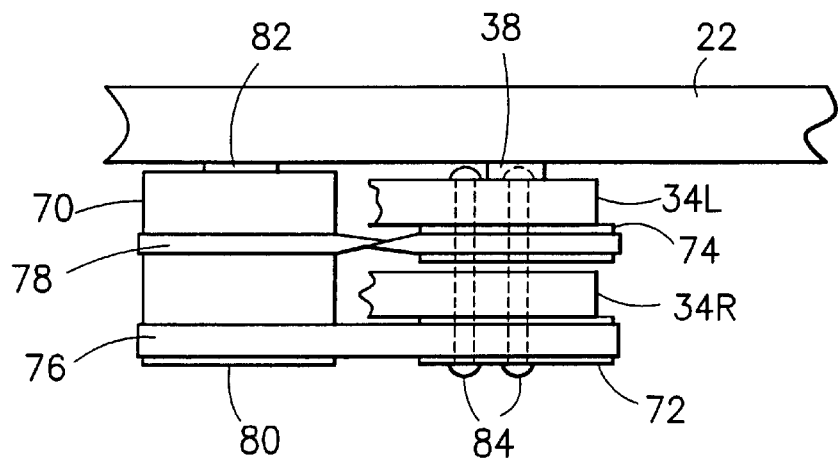
FIG. 5A is a partial side elevation view of the end effector alignment mechanism shown in FIG. 5.

Referring now to FIGS. 2, 5 and 5A, the movable arm assembly 18 further comprises an end effector alignment mechanism 70. FIG. 5 shows a top plan view of the alignment mechanism and FIG. 5A shows a side elevation view of the mechanism 70. The end effector alignment mechanism 70 maintains the end effector 22 aligned with the axis of translation C as the movable arm assembly 18 is extended or retracted between its home position shown in FIG. 2B and either the forward extended position shown in FIG. 2A or the rear extended position shown in FIG. 2C. The end effector alignment mechanism 70 includes an upper drive pulley 74 and a lower drive pulley 72 driving a single idler pulley 80 via two independent drive belts 78, 76 (see FIG. 5A). The two drive pulleys 72, 74 and the idler 80 have substantially the same diameters. The upper drive pulley 74 is fixedly mounted, by suitable mechanical fasteners 84, to the left forearm link 34L to rotate in unison with the forearm link 34L about pivot shaft 38. The lower drive pulley is fixedly mounted, by suitable mechanical fasteners 84, to the right forearm link 34R to rotate in unison with the forearm link 34R about pivot shaft 38. Hence, the drive pulleys 74, 72 rotate about a common axis of rotation at the wrist joint 26 of the movable arm assembly 18 (see FIG. 5). Furthermore, as the left and right forearm links 34L, 34R counter rotate about pivot shaft 38 during extension or retraction of the movable arm assembly 18, the drive pulleys 74, 72 counter rotate relative to each other. The idler 80 is pivotably mounted to the end effector 22 by an axle 82. The axle 82 is located on the end effector 22 so that the axle 82 lies substantially on the axis C extending between the shoulder end 24 and pivot shaft 38 (see FIG. 2). Each drive pulley 74, 72 is drivingly connected by means of a corresponding drive belt 78, 76 to the idler 80. To connect two counter rotating drive pulleys 74, 72 to a common idler 80 requires that the drive belts 78, 76 connecting the pulleys 74, 72 to the idler 80 be configured to drive the single idler 80 in only one direction. In the preferred embodiment, the lower drive belt 76, which connects the lower driver 72 to the idler 80, loops around both driver 72 and idler 80 to synchronously rotate the idler 80 in the same rotational direction as the driver 72. The upper drive belt 78 forms a figure "8" shape around the upper driver 74 and idler 80 as shown in FIG. 5. The figure "8" shape reverses the drive rotation imparted by the driver 74 to rotate the idler 80 in the opposite direction from that of the upper driver 74. Thus, when the movable arm assembly 18 is extended, the upper driver 74 is rotated counter-clockwise by the left forearm link 34L about pivot shaft 38. The lower driver 72 is rotated clockwise by the right forearm link 34R about pivot shaft 38. The upper driver 74 rotates the idler 80 clockwise about axle 82 by means of the figure "8" shaped upper belt 78. The lower driver 72 also rotates the idler 80 clockwise about axle 82 by means of the loop shaped lower belt 76. In this manner, the counter rotating drivers 72, 74 drive the single idler 80 in only one direction. In alternate embodiments, the figure "8" shaped belt may connect the lower driver to the idler and the loop shaped belt may connect the upper driver to the idler. In yet other alternate embodiments, the single idler may be replaced by two independent idlers rotatably connected to a common axle. In these alternate embodiments, each driver may be connected to a corresponding one of the idlers by means of a loop belt. The upper belt 78 and lower belt 76 make no slip contact with the idler 80 and with the corresponding upper and lower drivers 74, 72. During extension or retraction of the arm 18, the rotation of the belts 78, 76 and idler 80 accommodate the rotation of the forearm links 34L, 34R relative to the end effector 22 while symmetrically adjusting the position of the end effector 22 relative to the rotating forearm links 34L, 34R to guidingly hold the end effector 22 generally aligned with the translation axis C. For example, during extension of the movable arm assembly 18 drift in the alignment of the end effector 22 so that the axle 82 of the idler 80 is to the left of the translation axis C is restrained by the upper belt 74. Drift in the alignment of the end effector 22 moving the axle 82 to the right of the translation axis C is restrained by the lower belt 72. When the movable arm assembly 18 is retracted, the end effector alignment mechanism 70 aligns the end effector 22 to the translation axis C in a similar fashion as described above except the direction of motion of the various elements are reversed.

Figure 7:
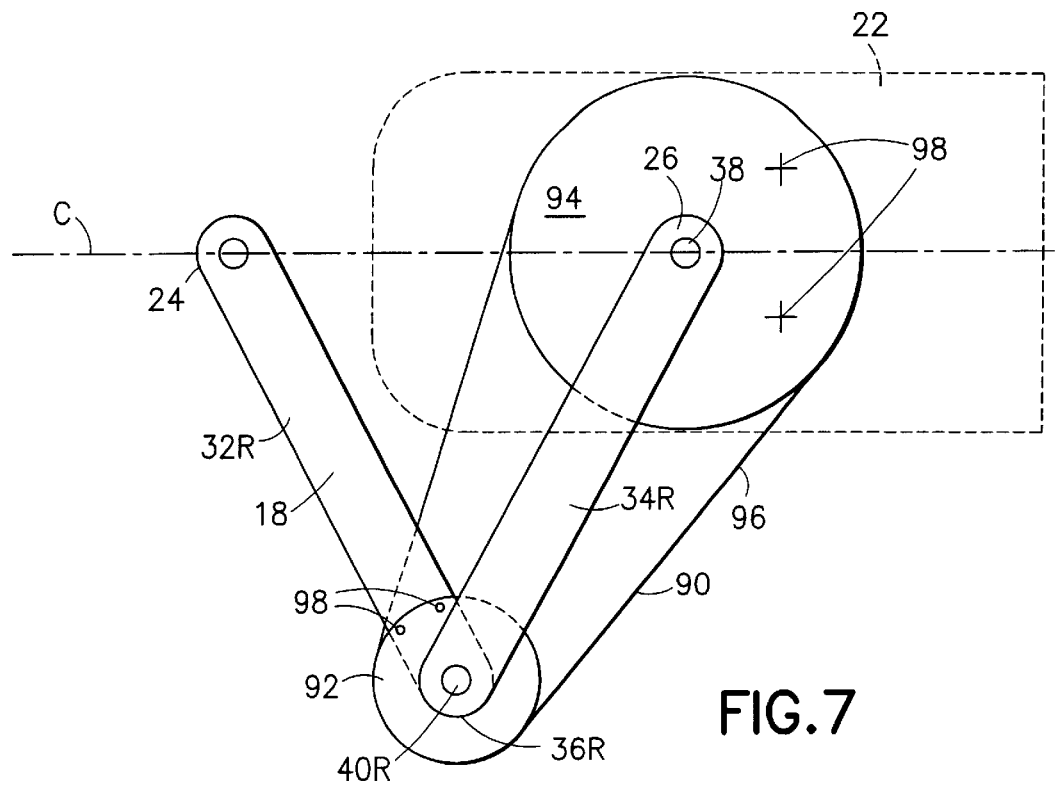
FIG. 7 is a schematic partial top plan view of the movable arm assembly of the substrate transport apparatus shown in FIG. 2, showing an alternate embodiment of an end effector alignment mechanism.

Referring now to FIG. 7, there is shown a partial top plan view of the movable arm assembly 18 with a second embodiment of an end effector alignment mechanism 90. FIG. 7 shows the right upper arm link 32R and the right forearm link 34R of the movable arm assembly 18. The left upper arm link 32L and the left forearm link 34L are omitted for clarity. The alignment mechanism 90 comprises a drive pulley 92 connected to driven pulley 94 by a drive belt 96. In the preferred embodiment, the drive pulley 92 is fixedly mounted to the right upper arm link 34R. In an alternate embodiment, the drive pulley may be mounted to the left upper arm link. As, shown in FIG. 7, the drive pulley 92 is fixedly mounted to the right upper arm link 34R to rotate in unison with the link about the pivot shaft 40R at the right elbow 36R. The driven pulley 94 is pivotably connected to the right forearm 34R by pivot shaft 38 so that the forearm 34R and pulley 94 may rotate relative to each other. The end effector 22 is fixedly mounted to the driven pulley 94 to rotate in unison with the pulley 94 about pivot shaft 38. The end effector 22 is mounted to the driven pulley 94 by any suitable mechanical fasteners 98 such as screws or bolts. The drive pulley 92 is also fixed to the right upper arm link 32R by mechanical fasteners 98. The drive belt 96 is looped around the drive pulley 92 and the driven pulley 94 to synchronously rotate the driven pulley 94 with the drive pulley 92. The belt 96 makes no slip contact with both the drive pulley 92 and the driven pulley 94. The ratio of the radius of the driven pulley 94 to the radius of the drive pulley 92 is about 2 to 1.

Figure 7A:
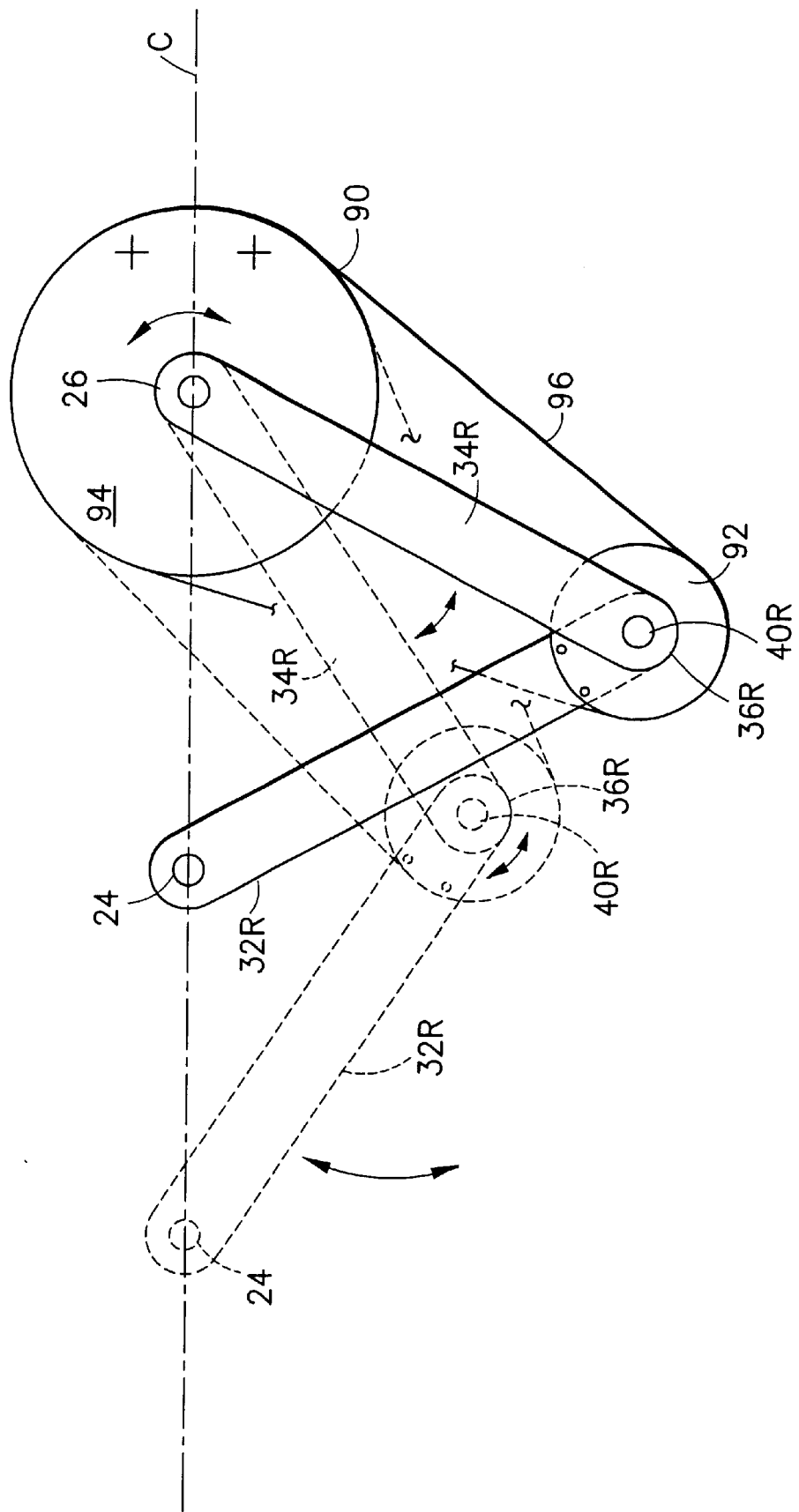
FIG. 7A is a second partial top plan view of the movable arm assembly showing the movement of the end effector alignment mechanism as viewed from the reference frame of the end effector of the movable arm.

During extension or retraction of the arm 18, the end effector alignment mechanism 90 harnesses the rotation of the right upper arm link 32R relative to the wrist joint 26 to maintain the end effector 22 aligned with the translation axis C. FIG. 7A shows the operation of the end effector alignment mechanism 90 when viewed from the perspective of the wrist end 26 of the movable arm assembly 18. In other words, in FIG. 7A the wrist end 26 of the movable arm assembly is fixed and all movements of the upper arm and forearm links 32R, 34R and of the end effector alignment mechanism 90 are shown relative to the wrist end 26. When the movable arm assembly 18 is extended, the right upper arm link 32R rotates counter-clockwise about the shoulder end 24 (see FIGS. 2A & 2B) When considered from the reference frame of the wrist joint 26, the rotation of the right upper arm link 32R about the right elbow 36R is again counter-clockwise (see FIG. 7A). The drive pulley 92 turns counter-clockwise in unison with the right upper arm link 32R about pivot shaft 40R at the right elbow 36R. The drive belt 96 transfers the counter-clockwise rotation of the drive pulley 92 to rotate the driven pulley 94 counter-clockwise about the pivot shaft 38 at the wrist end 26 of the arm 18. The alignment mechanism 90 operates to cancel the effect of the right forearm 34R rotation on the end effector 22. For instance, during extension of the movable arm assembly 18, the resulting clockwise rotation of the right forearm link 34R relative to the wrist end 26 tends to rotate the end effector 22 clockwise or to the right of the axis of translation C (see FIG. 7A). However, the counter-clockwise rotation imparted to the end effector 22 by the alignment mechanism 90 counteracts the clockwise rotation imparted to the end effector by the right forearm link 34R thereby maintaining the end effector aligned with the translation axis C during extension of the arm assembly 18. During retraction of the movable arm assembly 18, the end effector alignment mechanism 90 operates in a similar manner except that the movement of the various parts is reversed from that described above.

Figure 8A:
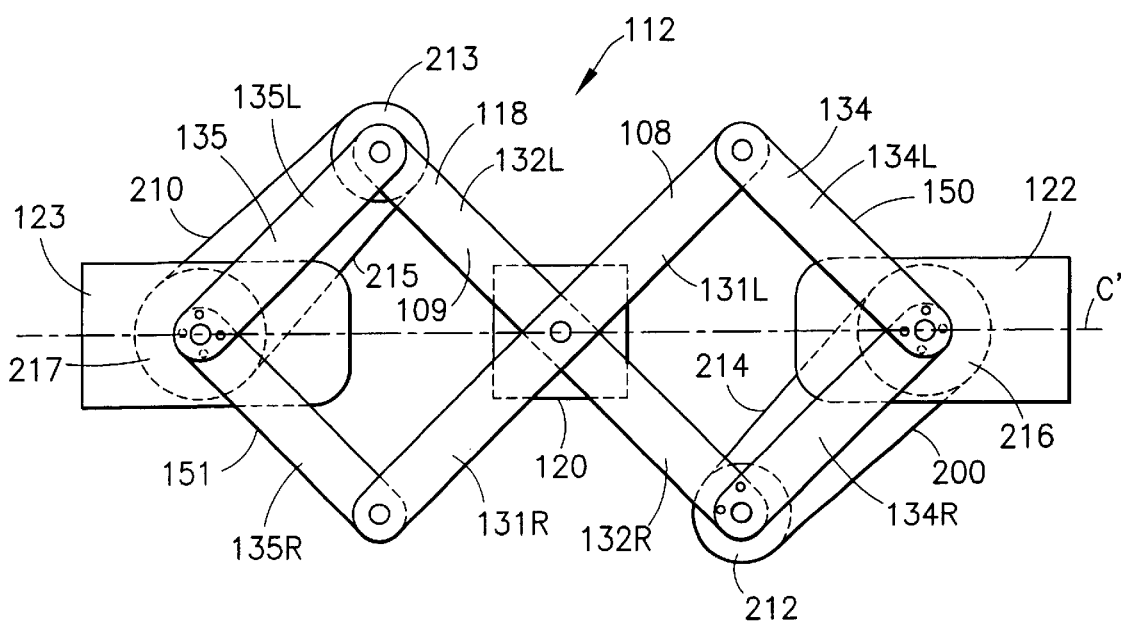
FIGS. 8A–8C are schematic top plan views of the substrate transport apparatus shown in FIG. 8 showing the movable arm assembly in two different positions.
Figure 8B:
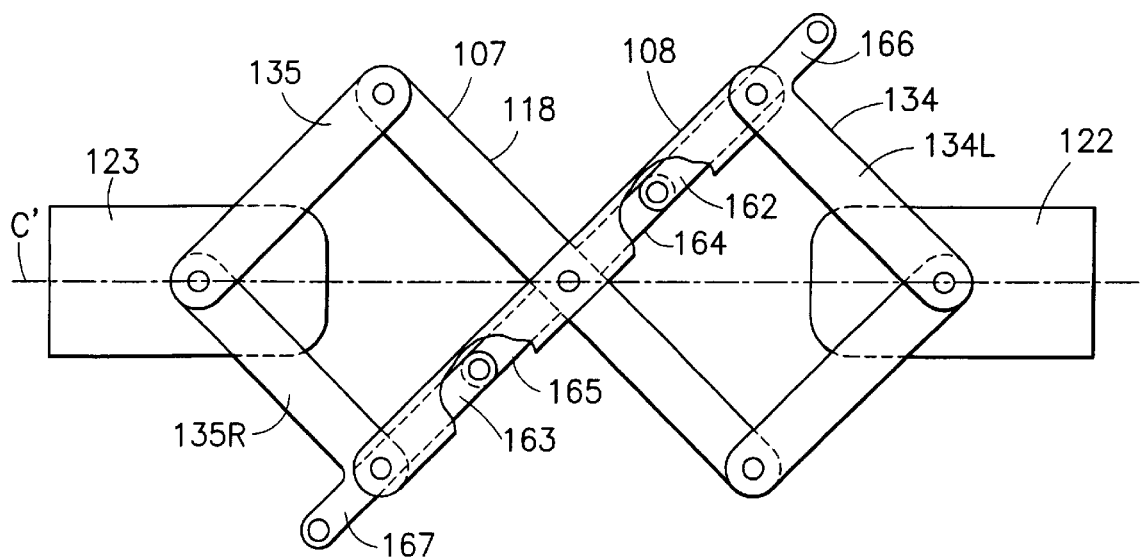
Figure 8C:
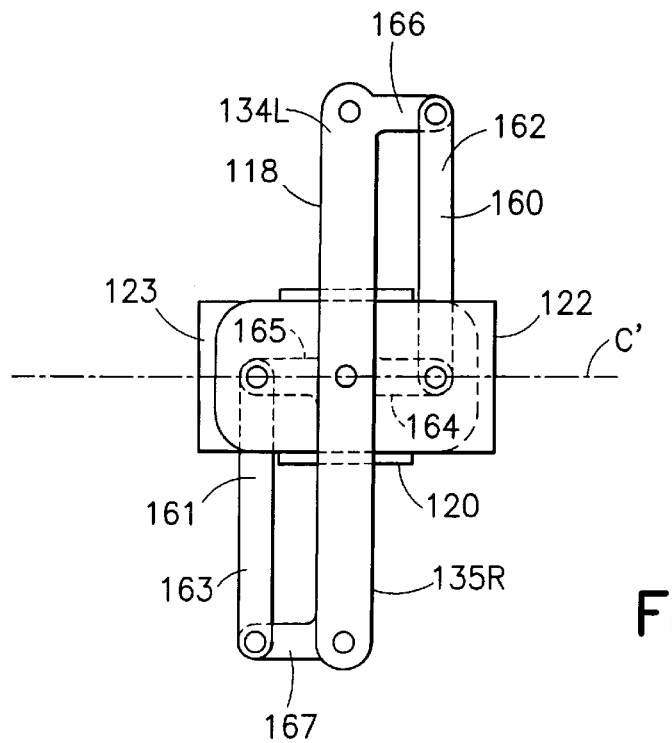

Referring now to FIG. 8, there is shown an alternate embodiment of the present invention. The transport apparatus 112 has a drive assembly 120 and a movable arm assembly 118. The movable arm assembly 118 has two proximal or upper arm members 108, 109, two pairs of forearm links 134, 135 and two end effectors 122, 123. The two upper arm members 108, 109 are connected to the drive assembly 120. Each end effector 122, 123 is connected to the upper arms 108, 109 by a corresponding pair of forearm links 134, 135. The movable arm assembly 118 is articulated to extend and retract the two end effectors 122, 123. The drive assembly 120 actuates the extension and retraction of the movable arm assembly 118. The upper arms 108, 109 are connected to the drive assembly 120 so that the upper arms 108, 109 are generally crossed (see FIG. 8). The crossed upper arm members 108, 109 form four upper arm sections 131L, 131R, 132L, 132R. Each upper arm member 108, 109 has a left upper arm section 131L, 132L and a right upper arm section 131R, 132R. The four upper arm sections 131L, 131R, 132L, 132R and the four forearm links 134L, 134R, 135L, 135R are connected to form two adjoining general trapezoidal shapes 150, 151. In the preferred embodiment, the co-axial drive shaft assembly 120 is located substantially at the center of the upper arms 108, 109. Thus, the left and right upper arm sections 131L, 132L, 131R, 132R of the upper arms 108, 109 are substantially of equal length. In alternate embodiments, the upper arms may each have a long upper arm section and a short upper arm section forming two opposing pairs of upper arm sections of disparate length, the length of the sections of one pair being longer than the length of the sections of the other pair. Each of the four upper arm sections 131L, 131R, 132L, 132R supports a corresponding forearm link 134L, 135R, 135L, 134R. Each of the left upper arm sections 131L, 132L of each upper arm member 108, 109 is pivotably connected to a corresponding left forearm link 134L, 135L of each pair of forearm links 134, 135. Each of the right upper arm sections 131R, 132R of each upper arm member 108, 109 is pivotably connected to a corresponding right forearm link 135R, 134R of each pair of forearm links 135, 134. Hence, each upper arm member 108, 109 is connected to two forearm links 134L, 135R, 135L, 134R, with one link of the two links connected to each upper arm member 108, 109 being from each pair of links 134, 135 supporting each end effector 122,123. The forearm links of each pair of forearm links 134, 135 are also pivotably connected to each other. Thus, each trapezoidal shape 150, 151 is similar to the trapezoidal shape formed by the movable arm assembly 18 in the embodiment of the invention shown in FIG. 2. The upper arm members 108, 109 are connected to the drive assembly 120 so that the upper arm members 108, 109 may be rotated by the drive assembly 120 either in unison with each other or relative to each other. Each forearm link 134L, 135R, 135L, 134R is rotatable relative to the corresponding upper arm section 131L, 131R, 132L, 132R to which the forearm link is connected. Each forearm link 134L, 135R, 135L, 134R is also rotatable relative to its adjoining forearm link. Each end effector 122, 123 is pivotably connected to the corresponding pair of forearm links 134, 135 attaching the end effectors to the upper arm members 108,109. The forearm links 134L,134R supporting the first end effector 122 rotate relative to that end effector 122 about a common axis of rotation. The forearm links 135L, 135R supporting the second end effector 123 rotate relative to that end effector 123 about a common axis of rotation.

Rotation of the upper arm members 108, 109 in unison results in the rotation of the end effectors 122, 123 about the drive assembly 120, similar to the rotation of the movable arm assembly 18 in the embodiment of the invention shown in FIG. 2. When the drive assembly rotates the upper arm members 108, 109 relative to each other (i.e. counter rotates the upper arm members), the movable arm assembly 118 is extended or retracted. Extension and retraction of the movable arm assembly 118 effect substantially rectilinear translation of the two end effectors 122, 123 along axis of translation C' (see FIG. 8). When translating the end effectors 122, 123, the forearm links 134L, 134R, 135L, 135R and the upper arm sections 131L, 132R, 132L, 131R operate similar to the upper arm links 32L, 32R and the forearm links 34L, 34R of the movable arm assembly 18 in the embodiment of the invention shown in FIG. 2. Referring also to FIGS. 8A and 8B, the movable arm assembly 118 has two positions, a retracted or home position shown in FIG. 8B and an extended position as shown in FIG. 8A. When the movable arm assembly 118 is in its home position, the end effectors 122, 123 are located generally over the drive section 120 (see FIG. 8B). In this position, the movable arm assembly 118, no longer forms two trapezoidal shapes. Rather, when the movable arm assembly 118 is in its home position, the upper arm members 108, 109 are vertically aligned with each other and intersect the axis of translation C' at an angle of about 90°. The right forearm links 134R, 135R, are vertically aligned with the right upper arm sections 131R, 132R and the left forearm links 134L, 135L, are vertically aligned with the left upper arm sections 131L, 132L. From its home position shown in FIG. 8B, the movable arm assembly is 118 extended outwards to its extended position shown in FIG. 8A. Extension of the movable arm assembly 118 translates the end effectors 122, 123 in opposite directions along axis C'.

The movable arm assembly 118 has two transmission assemblies 160, 161 to transmit rotation from an upper arm member 109 to the forearm links 134L, 135R. The transmission assemblies 160, 161 are substantially similar to the transmission linkage 60 of the embodiment shown in FIG. 6B. Each transmission assembly 160, 161 comprises a connecting link 162,163 pivotably connected to a drive crank 164, 165 on the upper arm member 109 and pivotably connected to an extension member 166, 167 cantilevered from a forearm link 134L, 135R. The first transmission assembly 160 transmits torque from the second upper arm member 109 to the left forearm link 134L supporting the first end effector 122. The second transmission assembly 161 transmits torque from the second upper arm member 109 to the right forearm link 135R supporting the second end effector 123. The transmission assemblies 160, 161 operate substantially similar to the transmission linkage 60 of the embodiment of the invention shown in FIGS. 6A and 6B. The rotation of the second upper arm member 109 relative to the first upper arm member 108 is transmitted by means of the connecting links 162, 163 from the corresponding cranks 164, 165 to the left and right forearm links 134L, 135R respectively. This rotates the left and right forearm links 134L, 135R relative to the first upper arm member 108 thereby enabling the movable arm assembly 118 to extend from its home position.

Still referring to FIG. 8, the movable arm assembly 118 of this embodiment of the invention further comprises two end effector alignment mechanisms 200, 210. The end effector alignment mechanisms 200, 210 are substantially similar to the alignment mechanism 90 in the embodiment of the invention shown in FIG. 7. Each end effector alignment mechanism comprises a drive pulley 212, 213 connected by a drive belt 214, 215 to a corresponding driven pulley 216, 217. The drive pulleys 212, 213 are fixedly connected to the second upper arm member 109. Each driven pulley 216, 217 is fixedly connected to a corresponding end effector 122, 123. As in the alignment mechanism 90 of the embodiment shown in FIG. 7, each drive pulley 212, 213 is attached to the upper arm member 109 to rotate in unison with the upper arm member 109. The first driven pulley 216 is attached to the first end effector 122 so that pulley and end effector 122 rotate in unison. The second driven pulley 217 is attached to the second end effector 123 so that pulley and end effector 123 also rotate in unison. The drive belts 214, 215 of each alignment mechanism 200, 210 loop around the respective driver pulleys 212, 213 and driven pulleys 216, 217. The ratio of the diameter of the driven pulley to the diameter of the driver pulley is about 2 to 1 for each alignment mechanism 200, 210. Each end effector alignment mechanism 200, 210 serves to maintain the corresponding end effectors 122, 123, to which the alignment mechanism 200, 210 is connected aligned with the translation axis C' during extension and retraction of the movable arm assembly 118. Each end effector alignment mechanism 200, 210 operates to maintain the alignment of the corresponding end effector 122, 123 in a manner substantially similar to the operation of the end effector alignment mechanism 90 of the embodiment shown in FIGS. 7 and 7A and previously described.

The transport cycle of both the substrate transport apparatus 12 of the first embodiment of the invention, shown in FIG. 2, and of the substrate transport apparatus 112 of the second embodiment of the invention, shown in FIG. 8, is as follows. The substrate transport apparatus 12 of the first embodiment of the invention has one end effector 22 and thus transports one substrate at a time. The substrate transport apparatus 112 of the second embodiment of the invention has two end effectors 122, 123 and thus may transport up to two substrates at a time. Otherwise, the steps of the transport cycle performed by the substrate transport apparatus 12, 112 are the same in the case of either embodiment. The transport cycle in both cases commences with the corresponding substrate transport apparatus 12, 112 being in its home position (see FIGS. 2B and 8B). A suitable controller (not shown) operates the drive section 20, 120 of the substrate transport apparatus 12, 112 to rotate the movable arm assembly 18, 118 and align the translation axis C, C', of the end effector 22, 122, 123 with a processing module 14 or loadlock 16 of the substrate processing apparatus 10 (see FIG. 1). After aligning the movable arm assembly 18, 118 with the proper module, the controller operates the drive section 20 to extend the movable arm assembly to its deployed position (depicted in FIG. 2A for the first embodiment of the invention, and depicted in FIG. 8A for the second embodiment of the invention) to capture a substrate in the module or loadlock with the end effector 22, 122, 123. The movable arm assembly 18 of the first embodiment of the substrate transport apparatus 12, and the movable arm assembly 118 of the second embodiment of the substrate transport apparatus 112 have a suitable predetermined range of extension so that when the movable arm assembly 18, 118 is fully extended to its deployed position the corresponding end effector 22, 122, 123 enters within the respective modules 14 or loadlocks 16 to capture or release a substrate therein. After capture of the substrate with the end effector 22, 122, 123, the movable arm assembly 18, 118 is retracted thereby translating the end effector 22, 122, 123 and the substrate held thereon to its home position (see FIGS. 2A, 8A). When, the end effector 22, 122, 123 is returned to its home position, the drive section 20, 120 rotates the movable arm assembly 18, 118 as commanded by the controller to align the translation axis C, C', of the end effector 22, 122, 123 with a new or destination module. After aligning the movable arm assembly 18, 118 with the destination module, the movable arm assembly is again extended to its deployed position (see FIGS. 2A, 8A) to release the substrate from the end effector 22, 122, 123 leaving it within the module. Upon release of the substrate from the end effector 22, 122, 123, the movable arm assembly 18, 118 is retracted once again bringing the end effector 22, 122, 123 back to the home position to complete the transport cycle. The transport cycle is then repeated as many times as required.

The substrate transport apparatus 12, 112 of both embodiments of the present invention provide greater rigidity and improved control of transport movements in comparison to substrate transport apparatus of the prior art. The greater rigidity and better control over the apparatus of the prior art is achieved by having the end effector 22, 122, 123 of the substrate transport apparatus 12, 112 of both embodiments of the present invention located over the drive section 20, 120 and the upper arm links 32L, 32R or sections 131L, 131R, 132L, 132R and the forearm links 34L, 34R, 134L, 134R, 135L, 135R oriented at an angle of about 90° relative to the translation axis C,C' when the movable arm assembly 18, 118 is in its home position (see FIGS. 2B, 8B). This configuration of the movable arm assembly 18, 118, when in the home position, allows the substrate transport apparatus 12, 112 of both embodiments of the present invention to have shorter forearm links 34L/R, 134L/R, 135L/R and upper arm links or sections 32L/R, 131L/R, 132L/R than the forearm links and upper arm links on substrate transport apparatus of the prior art having a comparable range of extension. In effect, the present invention provides a substrate transport apparatus 12, 112 with a movable arm assembly 18, 118 having a range of extension (the distance between the home position and the deployed position of the movable arm assembly) equal to or larger than movable arm assemblies on substrate transport apparatus of the prior art, but comprised of forearm links 34L/R, 134L/R, 135L/R and upper arm links or sections 32L/R, 131L/R, 132L/R which are shorter than the comparable forearm links and upper arm links of the movable arm assemblies of the prior art. Shorter forearm links and upper arm links necessarily means a movable arm assembly with significantly higher lateral stiffness or rigidity over the arm assemblies in the prior art having comparable range of extension. As is well know, lateral deflection of a forearm or upper arm link ( which behaves generally as a slender cantilever) under the loading of lateral forces such as gravity corresponds directly with the cubed length of the forearm or upper arm link. Thus, a link that is ⅔ shorter than another link is approximately 3 times stiffer laterally than the longer link. This relationship is directly applicable to the entire movable arm assembly wherein an arm that is ⅔ shorter, but having an equal or greater range of extension than another, is approximately 3 times more rigid laterally than the longer arm. This results in less droop of the shorter movable arm assembly due to gravitational forces, and consequently, the movements of the shorter arm assembly are performed with greater precision over its longer brethren.

Figure 9:
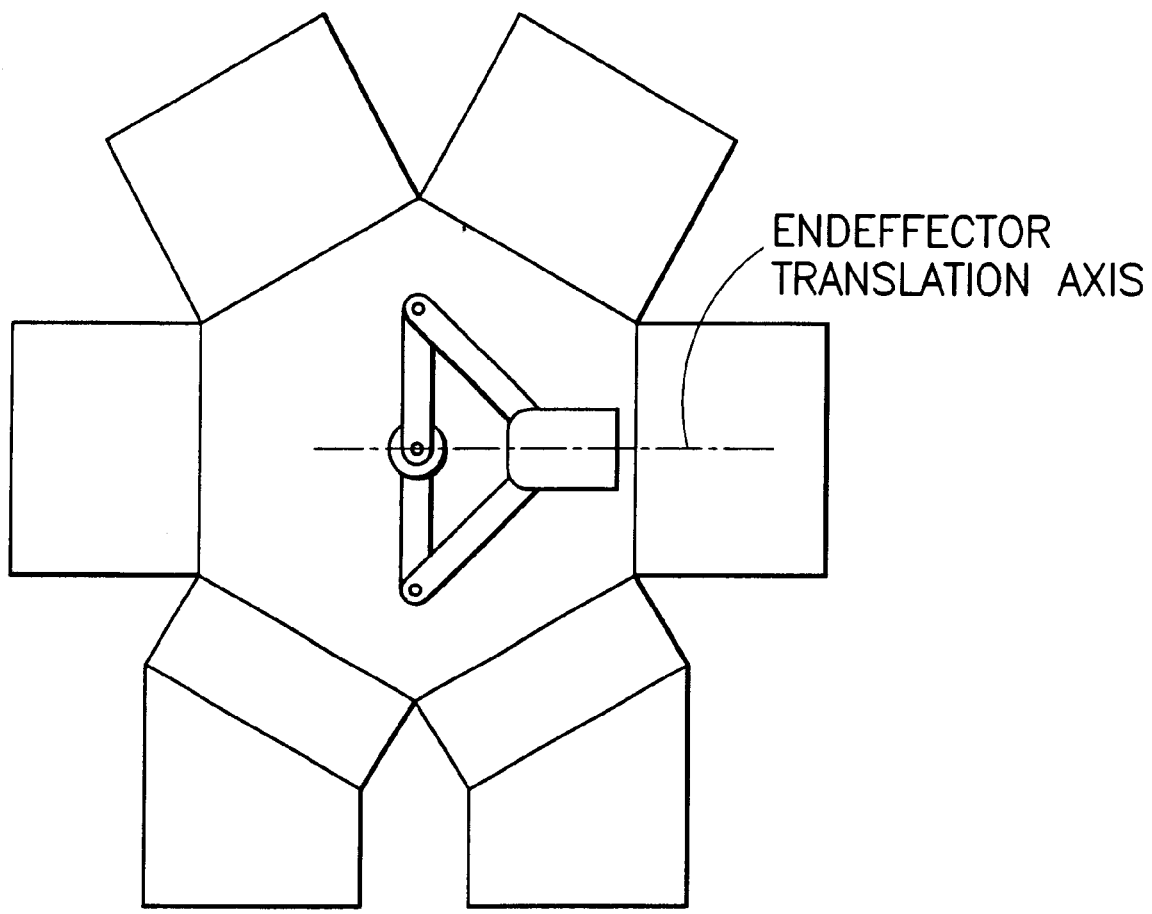
FIG. 9 is a schematic top plan view of a substrate processing apparatus of the prior art.

The movable arm assembly 18, 118; of both embodiments of the present invention (see FIGS. 2, 8) have a range of extension equal to or greater than arm assemblies of the prior art while including shorter forearm links 34L/R, 134L/R, 135L/R and upper arm links or sections 32L/R, 131L/R, 132L/R than the links of the prior art because the forearm and upper arm links of the present invention transit through a larger angle of rotation during extension or retraction of the arm 18, 118 than the links of the prior art. The range of extension of the movable arm assembly is a direct function of the length of the upper arm and forearm links and the angle of rotation through which these links transit during extension or retraction of the arm. Hence, increasing the angle of rotation facilitates a reduction in the requisite length of the forearm and upper arm links to obtain the same range of extension (see FIGS. 2A, 2B). In the movable arm assembly 18, 118 of both embodiments of the present invention, both forearm links 34L/R, 134L/R, 135L/R and upper arm links or sections 32L/R, 131L/R, 132L/R may transit through an angle of rotation of up to about 90° when the movable arm assembly 18, 118 transitions between its home position and its deployed position (see FIGS. 2A, 2B, 8A, 8B). In the prior art, the upper arm and especially the forearm links of the arm assembly transit through a much smaller angle of rotation than the links of the present invention (see FIG. 9). Thus, to obtain the same range of extension, the links of the movable arm assembly of the prior art must be longer than the forearm links 34L/R, 134L/R, 135L/R and upper arm links or sections 32L/R, 131L/R, 132L/R of the present invention. FIG. 9 shows an example of a substrate transport apparatus of the prior art with a movable arm assembly in its home position. The forearm and upper arm links of the arm assembly of the prior art rotate through a smaller angle because when the movable arm assembly of the prior art is in its home the forearm links are already angled relative to the translation axis of the end effector at an acute angle much smaller than 90°. In the prior art, the forearm links are angled relative to the translation axis of the end effector at a shallow acute angle to generate sufficient leverage and initiate movement of the end effector from its home position. However, this initial shallow angle of the forearm links relative to the translation restricts the allowable angle of rotation of the forearm links. During extension or retraction of the arm assembly of the prior art the forearm links can rotate no more than this shallow acute angle. In contrast, the forearm links 34L/R, 134L/R, 135L/R of both embodiments of the present invention are initially angled relative to the translation axis C, C' at an angle of about 90° and thus the links may rotate up to an angle of about 90°. In the prior art, increasing the relative angle between the forearm links and the translation axis, when the movable arm assembly is in the home position, reduces the leverage of the forearms thereby placing an increasingly higher torque demand on the drive section to commence translation of the end effector. The torque demand becomes prohibitively high when the relative angle between the forearms and translation axis approaches 90°. Both embodiments of the present invention overcome this limitation of the prior art, allowing the movable arm assembly 18, 118 to commence translation of the end effector from a home position where the forearm links 34L/R, 134L/R, 135L/R are angled relative to the translation axis C, C' at an angle of about 90°. This in turn minimizes the length of the forearm links 34L/R, 134L/R, 135L/R and upper arm links or sections 32L/R, 131L/R, 132L/R needed to provide the movable arm assembly 18, 118 with a predetermined range of extension, and thus increases the rigidity of the movable arm assembly 18, 118. Smaller links take up less space, thus also giving the substrate transport apparatus 12, 112 of the present invention a smaller planform than the substrate transport apparatus of the prior art (compare FIGS. 1 and 9). The reduction in the planform of the substrate transport apparatus 12, 112 of both embodiments of the present invention facilitates a reduction in the overall size of the entire substrate processing apparatus 10 in comparison to the prior art.

The substrate transport apparatus 12, 112 of both embodiments of the present invention increase the stability of substrates held on the end effectors 22, 122, 123 and reduce the torque required to rotate the movable arm assembly 18, 118 in comparison to the substrate transport apparatus of the prior art. In the substrate transport apparatus 12, 112 of the present invention, there is little or no eccentricity between the end effector 22, 122, 123, when in the home position, and the axis of rotation of the movable arm assembly 18, 118 (see FIGS, 2B, 8B). Thus, when the movable arm assembly 18, 118 is rotated with the end effector 22, 122, 123 positioned in its home position, the rotational inertial forces on a substrate held by the end effector are minimal. This reduces the tendency of the substrate to shift on the end effector. The lack of eccentricity between the end effector 22, 122, 123 and the axis of rotation of the movable arm assembly 22, 122, 123 also reduces the mass moment of inertia of the movable arm assembly of the present invention over that of the prior art. Hence, the start-up and braking torque required from the drive section 20, 120 to rotate the movable arm assembly 18, 118 of both embodiments of the present invention is significantly smaller than the torque required to rotate the movable arm assemblies of the prior art. The lower start-up and braking torque translates into increased precision in the rotation movements of the arm assembly of the present invention over the prior art.

It should be understood that the above description is merely illustrative of the invention. Various alternatives and modifications can be devised by those skilled in the art without departing from this invention. Accordingly, the present invention is intended to embrace all such alternatives, modifications and variances which fall within the appended claims.

What is claimed is:

1. A substrate transport apparatus comprising:

a drive section; and an articulated arm assembly pivotably mounted to the drive section, the arm assembly having a first end connected to the drive section and a second end supporting an end effector thereon;

wherein, the articulated arm assembly comprises a pair of opposing forearms on opposite sides of an axis of translation of the end effector, and a pair of upper arm links pivotably connecting the forearms to the first end of the arm assembly, a first one of the upper arm links being pivotably connected to a first one of the forearms and a second one of the upper arm links being pivotably connected to a second one of the forearms, the axis of translation extending substantially over a center of the first end of the arm assembly, and when the arm assembly is retracted to a home position with the second end of the arm assembly over the center of the first end of the arm assembly, the opposing forearms are angled relative to the axis of translation at an angle of about 90°, and wherein the first upper arm link has a crank member cantilevered therefrom at the first end of the arm assembly, the crank member being connected by a link to a lever cantilevered from an elbow end of the second forearm to synchronously rotate the elbow end of the second forearm with the rotation of the first upper arm link.

2. A substrate transport apparatus as in claim 1, wherein the crank member cantilevers at an angle of about 90° relative to the first upper arm link and the lever cantilevers at an angle of about 90° relative to the second forearm.

3. A substrate transport apparatus as in claim 1, wherein the crank member and the first upper arm link pivot about a common axis of rotation located at the center of the first end of the articulated arm assembly.

4. A substrate transport apparatus as in claim 1 further comprising means, mounted on the articulated arm assembly and connected to the end effector, for synchronously counter-rotating the end effector relative to one of the forearms so that the end effector remains substantially parallel to the axis of translation as the end effector traverses from a first position to a second position.

5. A substrate transport apparatus as in claim 1, wherein the forearms are pivotably connected to the end effector at a common wrist joint so that the forearms rotate relative to the end effector about a common axis of rotation at the wrist joint.

6. A substrate transport apparatus comprising:

a drive section; and an articulated arm assembly pivotably mounted to the drive section, the arm assembly having a first end connected to the drive section and a second end supporting an end effector thereon;

wherein, the articulated arm assembly comprises a pair of opposing forearms on opposite sides of an axis of translation of the end effector, the forearms being pivotably connected to the end effector at a common wrist joint, and wherein a first one of the forearms has a drive drum connected thereto so that the drum and the first forearm rotate in unison relative to the end effector about a common axis of rotation at the wrist joint, the drive drum being connected by a drive belt to an idler on the end effector.

7. A substrate transport apparatus comprising:

a drive section; and a movable arm assembly comprising two proximal arm members and two end effectors, each proximal arm member being connected to the drive section so that the two proximal arm members are generally crossed and the end effectors being located at opposite ends of the proximal arm members with each end effector being connected to an end of each proximal arm member;

wherein, when the end effectors are over the drive section, the proximal arm members are vertically aligned.

8. A substrate transport apparatus as in claim 7, wherein each end effector is connected to the corresponding ends of the proximal arms by two links.

9. A substrate transport apparatus as in claim 8, wherein the links are pivotably connected to the corresponding end effector so that the links on each end effector rotate relative to the corresponding end effector about a common axis of rotation.

10. A substrate transport apparatus as in claim 7, wherein a first proximal arm has a drive drum fixedly mounted to a first end of the proximal arm, the drive drum being connected by a belt to a driven drum fixedly mounted to the end effector supported from the first end of the proximal arm.

11. A substrate transport apparatus as in claim 10, wherein diameters of the driven drum to drive drum form a ratio of about 2 to 1.

12. A substrate transport apparatus as in claim 7, further comprising means, mounted on the movable arm assembly, for translating one of the end effectors substantially rectilinear along an axis of translation, the one end effector being translated from a first position over the drive section to a second position on one side of the drive section.

13. A substrate transport apparatus comprising:

a frame;

an articulated arm having a pair of opposing upper arms, a pair of forearms and an end effector, wherein the upper arms are pivotably connected to the frame at a shoulder joint, a first one of the forearms is pivotably connected to a first one of the upper arms at a first elbow joint, a second one of the forearms is pivotably connected to a second one of the upper arms at a second elbow joint and the forearms are pivotably connected to the end effector at a wrist joint;

means for synchronously rotating an elbow end of the second forearm with the rotation of the first upper arm, the means comprising at least one rotation transfer element extending between a shoulder end of the first upper arm and elbow end of the second forearm so that rotation of the first upper arm directly rotates the elbow end of the second forearm; and a pair of counter-rotating elements supported by the forearms wherein the counter-rotating elements counter-rotate relative to each other about a common axis of rotation at the wrist joint and wherein the counter-rotating elements are connected to the end effector and have a contact surface restrainingly contact the end effector to orientate the end effector true to an axis of translation of the end effector.

14. A substrate transport apparatus as in claim 13, wherein a first element of the pair of counter-rotating elements is fixedly mounted to a wrist end of the first forearm so that the first element rotates with the wrist end of the first forearm and a second element of the pair of counter-rotating elements is fixedly mounted to a wrist end of the second forearm so that the second element rotates with the wrist end of the second forearm.

15. A substrate transport apparatus as in claim 13, wherein the end effector has an idler pivotably connected thereto, the idler being connected to a first element of the counter-rotating elements by a first drive belt having a general hoop shape, the idler being connected to a second element of the counter-rotating elements by a second drive belt having a general figure 8 configuration.

16. A substrate transport apparatus as in claim 13, wherein the means for synchronously rotating an elbow end of the second forearm comprise a drive belt driven by a drive drum on the shoulder end of the first upper arm, and driving a driven drum and the elbow end of the second forearm.

* * * * *